United States Patent
Black

[11] Patent Number: 6,031,427
[45] Date of Patent: Feb. 29, 2000

[54] SYSTEM FOR SWEEPING A PHASE LOCK LOOP INTO LOCK WITH AUTOMATIC INITIATION AND SHUTDOWN

[75] Inventor: Michael F. Black, Garland, Tex.

[73] Assignee: Texas Instruments Incorporated, Dallas, Tex.

[21] Appl. No.: 09/021,649

[22] Filed: Feb. 10, 1998

Related U.S. Application Data

[60] Provisional application No. 60/040,648, Mar. 12, 1997.

[51] Int. Cl.[7] .................................................. H03L 7/12
[52] U.S. Cl. ........................... 331/4; 331/17; 331/DIG. 2; 331/176; 331/66
[58] Field of Search ................... 331/17, 4, 66, 331/DIG. 2, 176

[56] References Cited

U.S. PATENT DOCUMENTS

| | | | |
|---|---|---|---|
| 4,077,015 | 2/1978 | Carson et al. ................................. | 331/4 |
| 5,576,666 | 11/1996 | Rauvola ..................................... | 331/25 |

FOREIGN PATENT DOCUMENTS

| | | |
|---|---|---|
| 0 308 285 | 3/1989 | European Pat. Off. . |
| 0308285 | 3/1989 | European Pat. Off. . |
| 2812377 | 3/1991 | European Pat. Off. . |
| 28 12 377 | 9/1979 | Germany . |
| 56 069934 | 6/1981 | Japan . |
| 56- 069934 | 6/1981 | Japan . |
| 03 136523 | 6/1991 | Japan . |
| 03136523 | 6/1991 | Japan . |
| 07 297707 | 11/1995 | Japan . |
| 07297707 | 11/1995 | Japan . |

*Primary Examiner*—Arnold Kinkead
*Attorney, Agent, or Firm*—Mark E. Courtney; W. James Brady, III; Richard L. Donaldson

[57] ABSTRACT

A phase locked loop ("PLL") 28 containing apparatus for automatically causing the PLL to achieve phase lock when first energized or after having lost phase lock. In addition to a phase detector 4, loop filter 13, voltage controlled oscillator ("VCO") 14 and feedback from the VCO to the phase detector 16, the PLL has a sweep circuit 30. The sweep circuit cooperates with the loop filter when the PLL is not in phase lock to automatically generate a control voltage for the VCO which control voltage increases linearly with time until the PLL achieves phase lock or until the control voltage has reached the largest voltage in the dynamic input range of the VCO. In the event that phase lock is not achieved during the period of the increasing voltage, the control voltage decreases linearly with time to drive the PLL into phase lock.

15 Claims, 4 Drawing Sheets

SYSTEM FOR SWEEPING A PHASE LOCK LOOP INTO LOCK WITH AUTOMATIC INITIATION AND SHUTDOWN

This is a Non Provisional application filed under 35 USC 119(e) and claims priority of prior provisional, Ser. No. 60/040,648 of inventor Michael F. Black, filed Mar. 12, 1997.

BACKGROUND OF THE INVENTION

1. Field of the Invention

This invention relates to frequency control systems of the form commonly referred to as phase locked loops, and in the preferred embodiment, to analog phase locked loops.

2. Background of the Invention

The phase locked loop ("PLL") is a widely used frequency control system commonly found in various types of electronic apparatus. The PLL can be used for a variety of applications and utilizes a voltage controlled oscillator ("VCO"). The PLL serves to slave the frequency output of the VCO to an input reference signal such that the VCO frequency tracks variations in the input reference signal. One problem common to many of the applications is the necessity for a search action to initially direct the VCO to the correct frequency required for the PLL to begin to function. This process is often referred to as achieving "lock". At the beginning of operation, absent such a search action, the VCO frequency may wander aimlessly and never achieve lock. A second problem is the requirement that this search action cease when the correct frequency is found and the PLL achieves lock. The search and lock scenario is an action that may occur many times during the time a PLL circuit is active.

The requirement for PLL search is not new. Various approaches to achieve lock have been known in the past. Other known systems for the purpose of sweeping a VCO in an analog PLL fall into two categories: 1) self starting sine wave oscillators, and 2) search circuits requiring outside start/stop commands. Each of these two types has certain disadvantages associated with it.

Self starting sine wave search circuits are usually very complicated and the search portion of the circuitry may represent an unacceptably high portion of the system. A typical prior art circuit of this type is illustrated in FIG. 1. A phase detector 4 processes an input signal 2 to provide an output error signal. This error signal is an input to a bandlimiting loop filter 13 comprised of operational amplifier ("op-amp") 8, input resistor 6, feedback resistor 10 and feedback capacitor 12. The output of the loop filter drives VCO 14 which in turn generates the PLL output signal 18. The PLL output signal 18 is also fed back via divide-by-N circuit 16 to provide a second input to phase detector 4. The circuit described to this point is a well known type 2 second order PLL. As previously mentioned, at the beginning of operation the output signal 18 may not be at the correct frequency corresponding to the value of input signal 2. Absent additional intervention, the frequency may never reach the correct value so that lock can be achieved.

The addition of feedback network 20 results in a search action which directs the VCO output frequency to the correct value. Feedback network 20 may be a Wien bridge or a shunt T network. It is connected to the non-inverting input of op-amp 8 so as to provide positive feedback around the op-amp. This positive feedback network cooperates with the characteristics of the loop filter to function as a sinewave oscillator, that is to generate a low frequency sinewave to sweep the VCO. When the VCO is driven to the correct frequency and the PLL achieves lock, the feedback with the PLL in lock is enough to overcome the positive feedback of the loop filter oscillator circuit and it stops oscillating. While the circuit appears straightforward, its applications are limited. The sine wave sweep is inefficient and the circuit elements are very critical. The loop filter design goals may have to be compromised to satisfy the additional oscillator requirements.

The second category of prior art search circuits is illustrated in FIG. 2. Again, the PLL used in this illustration is of type 2, second order, and its components are the same as those described in connection with FIG. 1. In this case, the sweep action is provided by current injected into the feedback circuit of the loop filter by a switched constant current source 24. Current source 24 operates under the control of a search control signal 22 which in turn is generated by a search control circuit (not shown). The loop filter again does double duty. During search it acts as an integrator. A constant current input provided by current source 24 results in a ramp voltage provided to the VCO so as to drive it to the correct frequency and achieve lock. This type of search operation requires the additional circuitry to recognize when the PLL is not in lock and to generate the start and stop commands for the constant current source 24.

SUMMARY OF THE INVENTION

An embodiment of the invention will be disclosed in the context of a type 2, second order PLL similar to that shown in FIGS. 1 and 2. Rather than the self starting sine wave oscillator approach or the switched constant current source displayed in those two figures respectively, this invention utilizes a unique self starting sweep circuit to steer the VCO to the correct frequency so that lock can be achieved. In the preferred embodiment, the sweep circuit cooperates with the loop filter to provide a low frequency triangular search voltage to drive the VCO slowly up and down through its frequency range until the correct frequency is reached and lock occurs. Once this happens, the sweeping action is no longer required and it automatically stops. Since the sweep action is interrupted during periods when the PLL is in lock, there is no detrimental effect on the normal operation of the PLL. If the reference input signal should change so abruptly as to cause the PLL to lose lock, or if the reference input signal is temporarily interrupted such that lock is lost, the sweep circuit will automatically turn on and begin a search so as to regain lock. In the preferred embodiment, the sweep circuit is realized with the addition of only one op-amp and three resistors.

More specifically, the non-inverting input of the additional op-amp is coupled through an input resistor to the output of the loop filter, that is the input of the VCO. A second resistor is connected between this non-inverting input and the output terminal of the op-amp, thereby providing positive feedback around the op-amp. As such, the op-amp, together with its associated resistors, functions as a well known Schmitt-trigger circuit. It's output voltage will always be a constant voltage at one of two levels. This output is coupled by a current limiting resistor to the inverting input of the op-amp used in filter 13.

Assuming that the PLL is not in the locked condition, and if the Schmitt-trigger output voltage is at its high level, this output voltage is coupled through the current limiting resistor to the inverting input of the filter op-amp. Since, in the absence of lock, there will be no countervailing input from the phase detector, the current flowing through the current limiting resistor charges the capacitor in the feedback loop of the filter op-amp causing the VCO input voltage to decrease at a constant rate. If, during this period when its input voltage is decreasing, the VCO fails to reach an output frequency io corresponding to the frequency of the reference signal, lock will not be achieved. Ultimately, the VCO input voltage will reach a value sufficiently low that it will cause the Schmitt-trigger circuit to switch to a new output voltage at a constant low level. Now the current flowing through the current limiting resistor flows in the opposite direction thereby charging the feedback capacitor of the filter op-amp in the opposite direction and the VCO input voltage begins to increase. In this way, the VCO input voltage takes the form of a triangular wave. (There will also be described an alternative embodiment wherein the VCO input voltage takes the form of a sawtooth.) At some point during a period of this triangular wave, the VCO output frequency will correspond to the reference signal frequency, and lock will be achieved.

When this happens, the output voltage of the Schmitt-trigger circuit will be at either the constant high or low voltage. If properly designed, the Schmitt-trigger will have sufficient hysteresis that it will only switch when the VCO input voltage is at its positive or negative extremity. If the PLL is operating normally, that is in lock, the VCO input voltage never reaches either of these extremities and the operation of the sweep circuit is inhibited. In contrast with the sinewave sweep circuits, it is not necessary to compromise the operation of the PLL with the needs of the sweep circuit. Further in contrast with the second category of prior art sweep circuits described above, there is no need for additional circuits to generate start and stop commands.

The invention will best be understood from the claims when read in conjunction with the detailed description and drawings wherein:

DESCRIPTION OF THE PREFERRED EMBODIMENT

Figure 1:
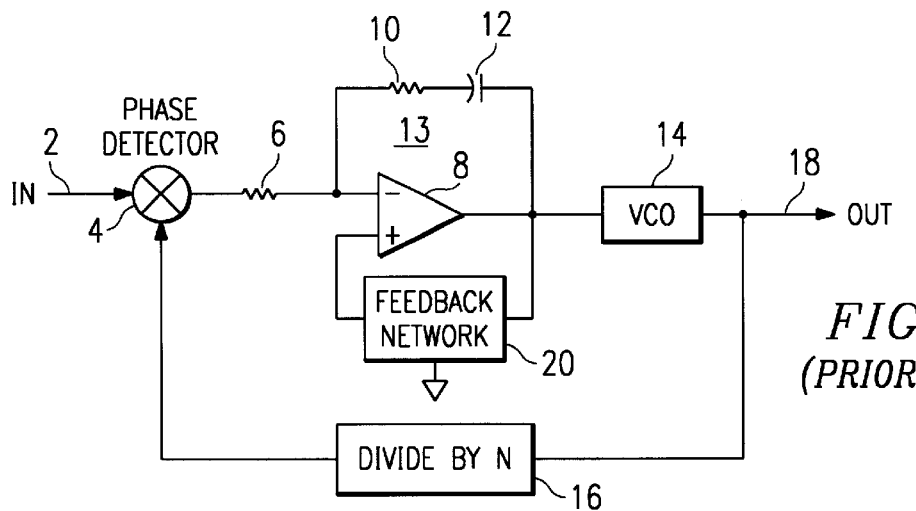
FIG. 1 is a diagram of a prior art PLL using positive feedback to generate a sinewave search.
Figure 2:
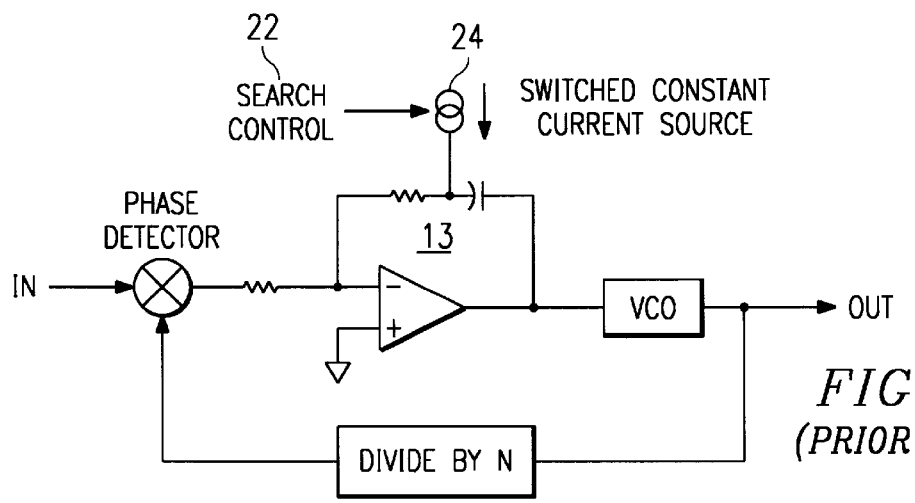
FIG. 2 is a diagram of a prior art PLL using a switched constant current source to generate a search voltage.
Figure 3:
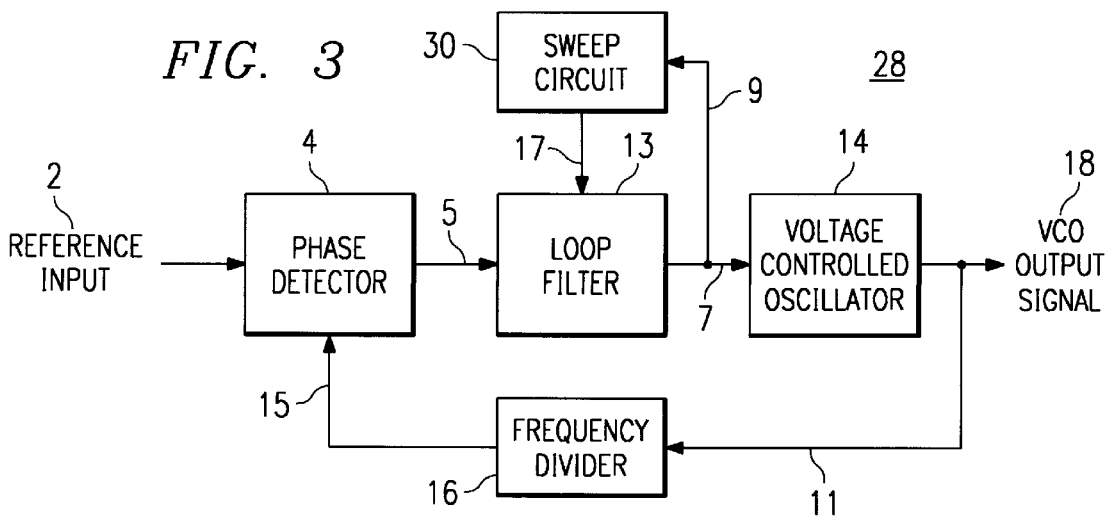
FIG. 3 is a block diagram of a PLL using the automatic sweep circuit of this invention.

The PLL 28 comprising the invention is depicted in block diagram form in FIG. 3. Common reference designators are used for elements of FIG. 3 which also appear in FIG. 1. A reference input 2 is in the form of an analog signal having a certain frequency or containing a signal having a certain frequency. The function of PLL 28 is commonly to cause VCO 18 to produce an output signal 18 at the frequency of reference input 2 or at some multiple (not necessarily integral) of the frequency of reference input 2.

Reference input 2 provides a first input signal to phase detector 4. A second input to the phase detector is the VCO output signal 18 after conditioning by frequency divider 16. In an application where the requirement is that the VCO provide an output frequency which is the same as the frequency of the reference input, the divide ratio of frequency divider 16 would be one and the output of VCO 14 could be coupled directly to the second input of phase detector 4. When the term frequency divider is used in this description and claims, it will be intended to embrace this condition of unity divide ratio. In the embodiment which will be described in greater detail here, the divide ratio is sixty-four.

Phase detector 4 generates an error signal representing the difference between its two inputs and provides this error signal via line 5 to loop filter 13. Loop filter 13 conditions the error signal, typically by amplifying and bandpass filtering. The output of loop filter 13 is coupled to VCO 14 by line 7. The output of VCO 14 represents the output of the PLL and is also coupled to frequency divider 16 by line 11. Finally, the output of frequency divider 16 is coupled by line 15 to the second input of phase detector 4.

The output of loop filter 13 is coupled by lines 7 and 9 to the input of sweep circuit 30. The input signal level on line 9 is used by sweep circuit 30 to generate voltages which control the sweep search when the PLL is not in lock, and serves to prevent action by the sweep circuit 30 when lock has been achieved. The output of sweep circuit 30 is coupled by line 17 to loop filter 13 so as to drive VCO 14 to the frequency where lock can be achieved.

Figure 4:
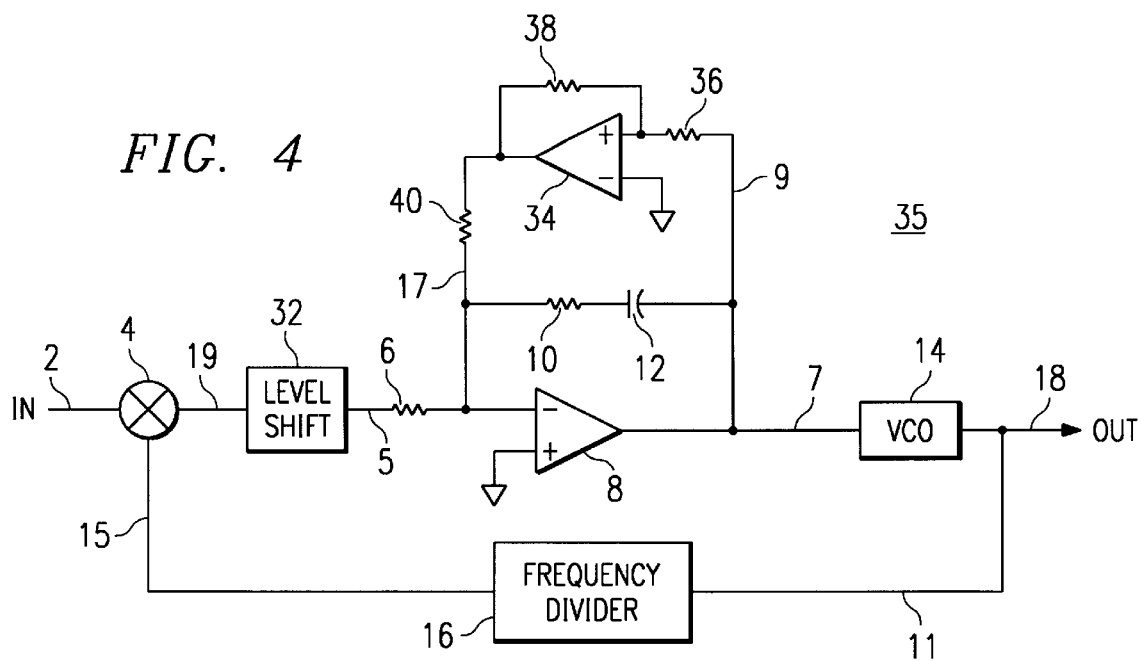
FIG. 4 is a partial schematic diagram of the PLL with the automatic sweep circuit.

FIG. 4 is a simplified schematic diagram of the PLL in sufficient level of detail to illustrate the principles of the invention. In the preferred embodiment, reference signal 2 has a nominal frequency of 15 Mhz. Phase detector 4 may be a model SYPD-1 available from Mini Circuits. The output of phase detector 4 is coupled by line 19 to the input of level shift circuit 32. The need for level shift circuit 32 is dictated by the desire to operate the PLL from a single power supply, having a nominal supply voltage of 8 volts. Phase detectors such as the SYPD-1 provide output voltages which vary in both the positive and negative directions from a DC voltage of zero volts. Given the single 8-volt supply voltage, the op-amps utilized in the PLL can only operate between voltage levels of zero and eight volts. Therefore, level shift circuit 32 is used to translate the output voltage of phase detector 4 from the level centered about zero volts to a level centered about some positive voltage, four volts in the preferred embodiment. Level shift circuit 32 will be shown in greater detail in a later figure. While a positive eight volt power supply is used in the preferred embodiment, the system will work equally well with negative supply voltages.

The output of level shift circuit 32 is coupled to the input of the loop filter, comprised again of op-amp 8, input resistor 6, feedback resistor 10 and feedback capacitor 12. The non-inverting input of op-amp 8 is coupled to a four volt reference level. Op-amps 8 and 34 may be the two sections of an AD822 operational amplifier available from Analog Devices, Inc. The output of the loop filter is coupled by line 7 to VCO 14 which has its output on line 18. The output of VCO 14 has a nominal frequency of 960 Mhz and will vary over a small range on either side of this nominal frequency under control of input reference signal 2. VCO 14 may be a model POS-1060 available from Mini Circuits. The output of VCO 14 is also coupled by line 11 to frequency divider 16. Frequency divider 16, in the disclosed embodiment, has a divide ratio of sixty-four and is available in the form of a MC12022 integrated circuit from Motorola Inc. The divided down output of frequency divider 16, nominally at 15 Mhz, is coupled by line 15 to phase detector 4.

The output of the loop filter is also provided by lines 7 and 9 to the input of sweep circuit 35. Sweep circuit 35 is comprised of input resistor 36, op-amp 34, feedback resistor 38 connected around op-amp 34, and a third resistor 40. The junction between resistors 36 and 38 is connected to the non-inverting input of op-amp 34 while the inverting input is connected to a four-volt reference. Finally, the output of op-amp 34 is coupled by resistor 40 to the inverting input of op-amp 8.

Selection of the resistor and capacitor values for the components shown in FIG. 4 is straightforward. Equations used for calculating these values with respect to the loop filter are well known and are summarized in an article entitled "Design of a Search Based PLL". This article was published in the Texas Instruments Technical Journal, Vol. 11, No. 2, March–April, 1994, pp 112–120, Dallas, Tex., and also in the conference proceedings of RF Expo East, Oct. 19, 1993, p. 275, Tampa, Fla. The relevant equations are:

$$R_{fb} = \frac{a}{\delta * f_n * C_{fb}} \quad (1)$$

$$R_{input} = \frac{K_{VCO} * K_{pd}}{2\delta * f_n^2 * C_{fb} * N} \quad (2)$$

$R_{fb}$ is the feedback resistor 10 of FIG. 4; a is the desired damping ratio; $f_n$ is the desired natural frequency; $C_{fb}$ is the feedback capacitor 12; $R_{input}$ is the input resistor 6; $K_{VCO}$ is the VCO gain, a known quantity for a given VCO; $K_{pd}$ is the phase detector gain, also a known for a given phase detector; and N is the divide ratio.

In this design example, a standard value of one microfarad will be selected for $C_{fb}$. Then with a target natural frequency of 212 Hz and target damping ratio of 4.14, the value of $R_{fb}$ is found from equation (1) to be 6,200 ohms. Other known parameters include the tuning rate of VCO 14, 2.239 Mhz/volt; the divide ratio of frequency divider 16, 64; and the conversion slope of phase detector 4, 0.81 volts/radian. With these parameters, the value of input resistor 6, $R_{input}$, is found from equation (2) to be 100,000 ohms. With these parameters, the system has a resultant closed loop 3 db frequency of 1886 Hz and a phase margin of 85.9 degrees.

It remains to select the values of resistance associated with the Schmitt trigger circuit. The inverting input of op-amp 34 is referenced to +4 volts. As a result, whenever the non-inverting input is at a voltage greater than four volts, the output of this op-amp will be at the positive supply voltage, eight volts, and whenever the non-inverting input is as a voltage less than four volts, the output will be at ground or zero volts. As the non-inverting input passes through four volts, the output rapidly switches between these two voltage levels. The non-inverting input will be at four volts only during the very brief instants when the Schmitt trigger circuit is switching in one direction or the other. As a result, the non-inverting input is not constrained to any particular voltage, and input resistor 36 combines with resistor 38 to form a voltage divider between the output voltage of loop filter op-amp 8 (hereinafter the "sweep voltage") and the output voltage of the Schmitt trigger op-amp 34.

Figure 5:
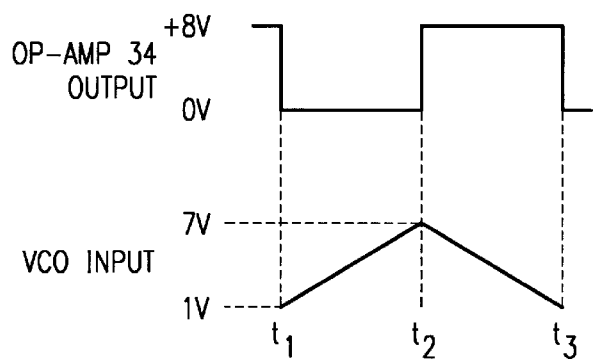
FIG. 5 shows representative voltage waveforms for the automatic sweep circuit.

FIG. 5 illustrates the voltages at the outputs of these two op-amps during the search operation. In the instance illustrated here, it is desired that the sweep voltage be in the form of a triangular wave that varies between the one volt and seven volt levels. At the instant that an already operating PLL should lose phase lock, the output of op-amp 34 will be either at zero or at eight volts. For ease of illustration, assume that at this instant, $t_1$, it is at zero volts and the sweep voltage is at one volt. Since the voltage divider consisting of resistors 36 and 38 is coupled between the zero and one volt levels, the non-inverting input of op-amp 34 will be at a voltage less than four volts. Given these conditions, feedback capacitor 12 will charge through resistors 40 and 10 and the sweep voltage will increase linearly. In this description and the claims appended hereto, this type of constant slope increasing (or conversely decreasing) sweep voltage will be referred to as varying linearly (or a linear variation) with time. This constantly increasing sweep voltage will continue until such time as the non-inverting input of op-amp 34 reaches the four volt level. It is desired that this happen at the instant that the sweep voltage reaches the seven volt level, designated as $t_2$ in FIG. 5. At this instant, the voltage divider consisting of resistors 36 and 38 will be coupled between the seven volt level of the sweep voltage and the zero volt level at the output of op-amp 34. The voltage at the non-inverting input of op-amp 36, $V_{ni}$, is given by the following expression.

$$V_{ni} = (7V - 0V) * \frac{R38}{R36 + R38}$$

A standard value such as 10,000 ohms may be selected for the value of resistor 38. Then, letting $V_{ni}$ be equal to four volts, this equation can be solved for the value of R36 which turns out to be 7,500 ohms. With these values for resistors 36 and 38, the sweep voltage will reach its maximum positive value at $t_2$. At this instant, the Schmitt trigger flips, its output goes to the eight volt level, and capacitor 12 begins to charge in the opposite direction with the result that the sweep voltage begins to decrease at a linear rate with time.

It remains to determine the value of resistor 40. The value of this resistor along with the value of capacitor 12 determine the time required for the sweep voltage to cover the upsweep or downsweep. Let it be assumed that, in either case, it is desired that the sweep occupy a period of 1.5 seconds. During either of these sweeps, the voltage across capacitor 12 will undergo a change of seven–one=six volts. Given the well known relationship between the voltage, V, and charge, q, on a capacitor, C, q=VC, and with a one microfarad capacitor, the change in charge, dq, corresponding to a six volt change, dV, is $6/10^6$. The current which provides this charge flows through resistor 40 and is constant since the voltage at one end of the resistor, the output of op-amp 34, will be constant at either zero volts or eight volts, and the voltage at the other end, the inverting input of op-amp 8, will be constant at four volts. The value of this current then is 4/R where R is the resistance of resistor 40. In calculating voltage changes, the voltage drop across feedback resistor R10 can be ignored since, with constant current flowing through it, this voltage drop will be constant. The change in capacitor charge, dq, is simply the product of this current and the time of the sweep, 1.5 seconds. Therefore:

$$dq=6/10^6=(4/R)*T=(4/R)*1.5$$

The solution of this equation gives 1 megohm as the value of resistor 40.

Assuming the presence of a valid reference input frequency 2, at some point during the sweep the VCO will be driven to this frequency and the PLL will achieve lock. (In the absence of a valid reference input frequency, the sweep action will simply continue until a valid input is applied to the system.) At the time lock is achieved, depending on whether lock was achieved during an upsweep half cycle or a downsweep half cycle, the output of the Schmitt trigger will be at either zero volts or eight volts. As long as lock continues, the voltage will remain at that level. The inverting input of op-amp 8 will continue to be constrained to the four volt level, so there will be a constant four volt drop across resistor 40 and a corresponding current in the resistor. In the locked condition, this current can not flow into capacitor 12 as was the case during the sweep operation, and flows instead through resistor 6. Since resistor 6 has a resistance of only 100,000 ohms, the result will be an error voltage of 0.4 volts at the output of level shift circuit 32. The only effect of this is a shift in the phase of the VCO output signal. In many applications this is of no consequence, and in such applications the sweep circuit has, in effect, automatically terminated its sweep action during the period that the PLL is in lock.

In the foregoing discussion of the sweep circuit, it was assumed that the sweep voltage was at one volt at the instant that the sweep process began. In fact, the sweep voltage will normally be at some voltage between the one and seven volt levels. The sweep operation will begin somewhere between the one and seven volt levels of one half cycle of the triangular sweep and proceed as described above.

In summary, the sweep circuit of this invention automatically initiates the search operation whenever there is an absence of lock in the PLL. Normally, within one full cycle of the triangular sweep waveform, lock will be achieved. When this occurs, the sweep circuit effectively and automatically terminates the sweep action.

Figure 6A:
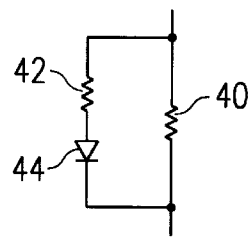
FIGS. 6 (a and b) illustrates another embodiment of the invention along with a resultant waveform.
Figure 6B:
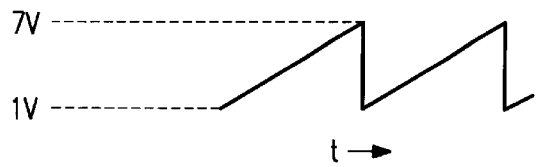

FIG. 6(*a*) is a schematic diagram of a modification of the invention. As a result of this modification, the sweep voltage waveform takes the form of a sawtooth as illustrated in FIG. 6(*b*). This is achieved by placing the series combination of a diode 44 and a relatively small resistor 42 in parallel with resistor 40. The diode is oriented to conduct current in the direction of the inverting input of op-amp 8. When the output of op-amp 34 is at the eight volt level the diode conducts, charging capacitor 12 very rapidly with the result that downsweep of the sweep voltage is almost instantaneous. If, for example, resistor 42 is a 10,000 ohm resistor (1/100 of the resistance of resistor 40), then the positive to negative "flyback" of the sweep voltage waveform will occupy a time period of approximately 0.015 seconds. AS shown in FIG. 6(*b*), this is virtually instantaneous in comparison with the period of the upsweep. When the sweep voltage reaches the lower end of its range (one volt in the example above), the Schmitt trigger switches its output low, diode 44 becomes back biased, and the circuit proceeds through an upsweep as above described. The sweep voltage flyback is sufficiently rapid that the system will not achieve lock during this flyback period. It is a certainty, then, that lock will be achieved only during the relatively slower upsweep. The output of op-amp 34 is low during the upsweep and, assuming that lock is achieved during an upsweep, will remain low during the time period while lock is maintained, that is during the time of normal operation of the PLL. Thus, when the PLL is in lock, the diode will be back biased, and will have no impact on the normal operation of the PLL. In another variation, the direction of the diode may be reversed. In this event, a sawtooth sweep signal will again be produced, but the flyback will occur at the end of the downsweep.

Figure 7:
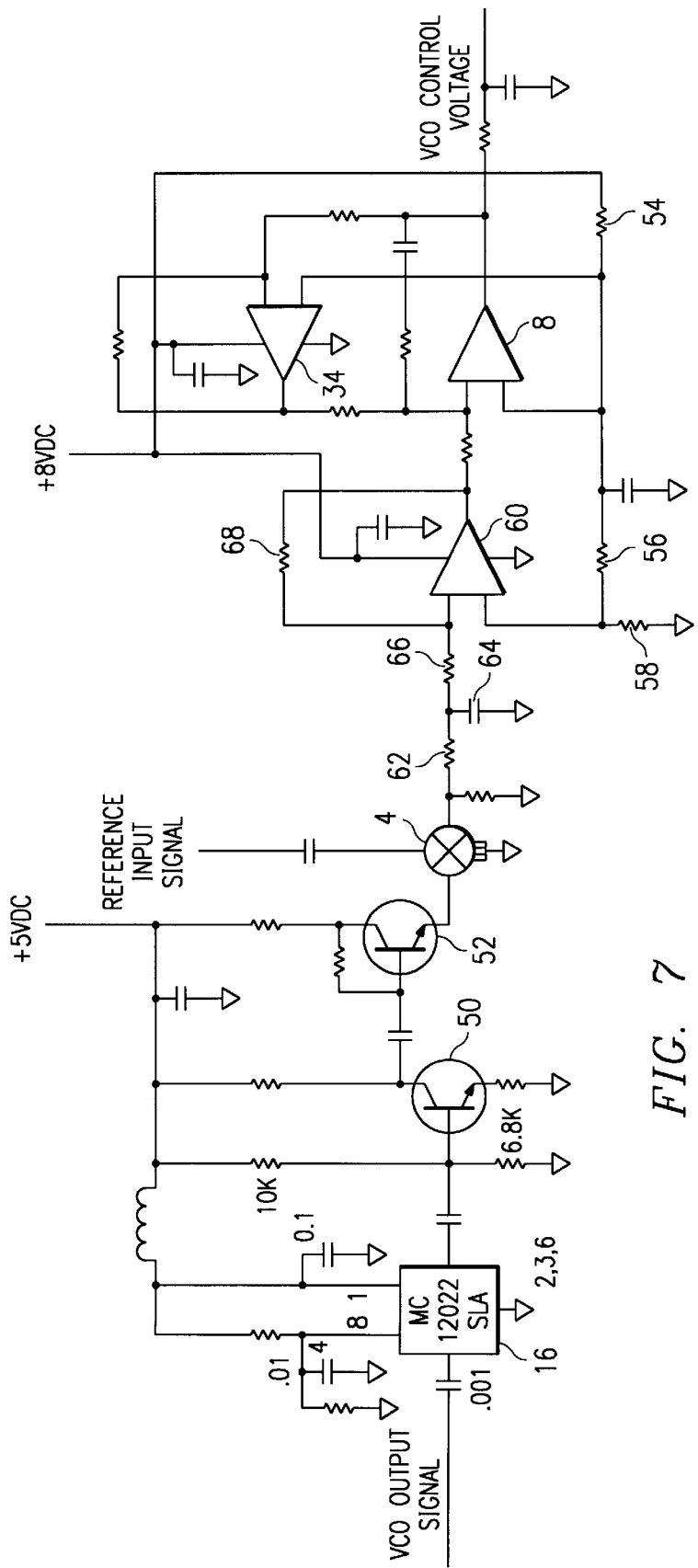
FIG. 7 illustrates additional circuit details of the automatic sweep circuit.

FIG. 7 illustrates additional details of the invention. Frequency divider 16 is seen to be the MC12022SLA integrated circuit. Transistors 50 and 52 may typically be 2N2222 transistors and, as is well understood in the art, are used to amplify the divided VCO output signal and provide impedance matching to phase detector 4.

Resistors 54, 56, and 58 divide down the eight volt supply voltage so as to provide the correct reference voltages for the op-amps. Since there is virtually no loading of these reference voltages by the high input impedances of the op-amps, it is a simple matter to select the correct resistor values. In the preferred embodiment, resistor 54 is equal to the sum of resistors 56 and 58 with the result that the inverting input of op-amp 34 and the non-inverting input of op-amp 8 are referenced to four volts. Resistors 56 and 58 are of equal value so that the non-inverting input of op-amp 60 is referenced to two volts. The precise resistance of these two resistors is a matter of design choice. Let it be represented by the symbol R.

Op-amp 60 may also be one section of an AD822, or any comparable op-amp. Resistors 62 and 66 are each chosen to have a resistance of 0.5R and resistor 68 a resistance of R. As a result, the gain of op-amp 60 with the feedback around it is unity, and the op-amp simply serves to shift the level of the signal coming from phase detector 4 to being centered about four volts. Capacitor 64 is chosen to cooperate with the resistances in the circuit to provide low pass filter action with a cutoff frequency near 30 Khz. As is well known, the output of phase detector 4 will have components representing both the sum and difference of the reference input and feedback signals. This low pass filtering action serves to prevent the sum of these two signals from distorting the operation of the op-amps.

Figure 8:
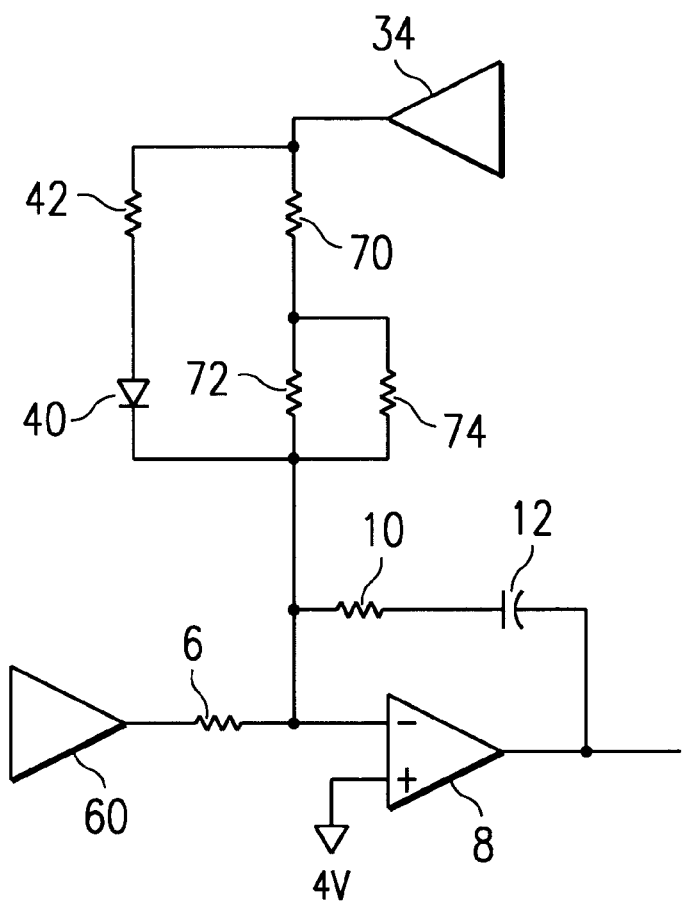
FIG. 8 illustrates an embodiment wherein a resistive network is added to compensate for temperature induced variations in the transfer function of the phase detector.

Another modification of the invention is shown in FIG. 8. The modification here consists of the replacement of resistor 40 by a network consisting of resistors 70 and 72 along with a temperature sensitive resistor or thermistor 74. In this context the term "thermistor" should be understood to contemplate a resistive element which has either a positive or a negative variation in resistivity with temperature. The functionality of op-amps 8, 34, and 60, resistors 6, 10, and 42, capacitor 12, and diode 40 have been discussed above. Just as in the case of the modification illustrated in FIG. 6(*a*), the portion of the circuit shown in FIG. 8 utilizes resistor 42 and diode 44 to ensure that lock is achieved only when the sweep is moving in a desired direction. With diode 44 in the orientation shown, once lock has occurred, the output voltage of the Schmitt trigger will be at its low value. While the resistive network provides the same functionality as does resistor 40 in the earlier disclosed embodiment, that is to cooperate with the value of feedback capacitor 12 to determine the rate of sweep, its particular characteristics serve to compensate for temperature variations which may occur in the transfer function of phase detector 4.

In some cases, available phase detectors may depart from the ideal in the sense that their outputs may not be symmetrical about ground, but are offset by some value which changes with temperature. Such is the case with a phase detector such as that available from Alpha Industries under the product designator SPD3456-18. When the phrase "temperature dependent variations in the transfer function of the phase detector" or like expressions are used in this description and the claims appended hereto, such references shall be intended to include and be descriptive of this temperature dependent offset. The variation in offset caused by temperature variations is often not acceptable, but can be resolved with the modified circuit of FIG. 8. This is achieved as follows.

Let it be assumed for the purposes of illustration that the D.C. output of phase detector 4 is not at zero volts, but is, instead, offset by some positive voltage which offset voltage increases as the temperature increases. In the PLL which has been disclosed above, there will be a certain offset voltage at the output of level shifting op-amp 60. As has been previously noted, this offset comes about as follows. With diode 40 oriented in the direction shown, it is certain that lock will be achieved only when the output of Schmitt trigger op-amp 34 is at its low level. Therefore, once lock is achieved, the current flowing through resistor 40, or through the resistive network comprised of resistors 70 and 72 along with thermistor 74, must flow in the direction of the output of op-amp 34. While this current flows through feedback resistor 10 during the sweep process, it is forced to flow through input resistor 6 once lock is achieved. This current causes a voltage drop across input resistor 6 and, since the inverting input terminal of op-amp 8 is slaved to the four volt reference at its non-inverting terminal, there will result a positive offset voltage at the output of op-amp 60. It is desired that, as the ambient temperature of the circuit varies, this offset be caused to vary in the same way as does the D.C. offset voltage of phase detector 4, that is to increase with temperature.

This can be accomplished if thermistor 74 is chosen to be a device having a negative temperature characteristic, that is one wherein the resistance decreases with increasing temperature. Such devices are available from Texas Instruments Incorporated under the name Sensistor™. While the overall resistance of the resistive network should be nominally one megohm to ensure the proper sweep speed, it will decrease slightly as the temperature increases because of the operation of thermistor 74. As this overall resistance decreases, the current flowing through the 20 network will increase slightly because the voltage across the network remains constant. This increased current, flowing through input resistor 6, will cause the offset voltage at the output of op-amp 60 to increase. By proper selection of resistors 70, 72, and thermistor 74, this increase in offset can be designed to very closely track the temperature generated increase in the offset of phase detector 4.

What is claimed is:

1. A phase locked loop comprising:
   a. a phase detector, said phase detector having a first input for receiving an input reference signal,
   b. a voltage controlled oscillator having an input operatively coupled to the output of said phase detector,
   c. a feedback circuit operatively coupling the output of said voltage controlled oscillator to a second input of said phase detector,
   d. a sweep circuit responsive to the signal level at the input of said voltage controlled oscillator for detecting the absence of lock in said phase locked loop and, in the absence of lock, automatically applying a sweep voltage to the input of said voltage controlled oscillator, said sweep voltage being automatically terminated when phase lock is acquired, and
   e. said sweep circuit including a resistor network comprising at least a resistor and a thermistor, the thermistor having a temperature dependence which compensates for a temperature dependence within said phase detector.

2. The phase locked loop of claim 1 wherein said sweep voltage varies linearly with time.

3. The phase locked loop of claim 1 wherein said sweep voltage increases linearly with time until a predetermined maximum voltage is reached and then decreases linearly with time until a predetermined minimum voltage is reached.

4. A phase locked loop comprising:
   a. a phase detector, said phase detector having a first input for receiving an input reference signal, the transfer function of said phase detector being temperature dependent,
   b. a voltage controlled oscillator having an input operatively coupled to the output of said phase detector,
   c. a feedback circuit operatively coupling the output of said voltage controlled oscillator to a second input of said phase detector,
   d. a network comprising at least a resistor and a temperature sensitive resistor, said network being adapted to compensate for temperature induced variations in the transfer function of said phase detector, and
   e. a sweep circuit for detecting the absence of lock in said phase locked loop and, in the absence of lock, automatically applying a sweep voltage to the input of said voltage controlled oscillator, said sweep voltage being automatically terminated when phase lock is acquired.

5. A phase locked loop comprising:
   a. a phase detector, said phase detector having a first input for receiving an input reference signal, said phase detector having a temperature dependent output,
   b. a loop filter having an input operatively coupled to the output of said phase detector,
   c. a voltage controlled oscillator having an input operatively coupled to the output of said loop filter,
   d. a divide circuit operatively coupling the output of said voltage controlled oscillator to a second input of said phase detector,
   f. a sweep circuit receiving an input signal from said loop filter and, responsive to a predetermined condition of said input signal, cooperating with said loop filter to automatically apply a sweep voltage to the input of said voltage controlled oscillator, said sweep voltage being terminated when lock is achieved by said phase locked loop, and
   g. a resistor network coupled to said sweep circuit and said loop filter comprising at least a resistor and a thermistor, said thermistor having a temperature dependence which compensates for the temperature dependence of said phase detector.

6. The phase locked loop of claim 5 wherein said sweep circuit, during those periods when the phase locked loop has not acquired lock, alternately applies two different constant level currents to said loop filter.

7. The phase locked loop of claim 5 wherein said sweep voltage increases linearly with time until a predetermined maximum voltage is reached and then decreases linearly with time until a predetermined minimum voltage is reached.

8. The phase locked loop of claim 7 wherein the duration of said linearly increasing sweep voltage differs from the duration of said linearly decreasing sweep voltage.

9. The phase locked loop of claim 5 wherein said loop filter comprises an operational amplifier with an input resistor coupled to its inverting input and a resistor-capacitor network coupled between the output of said operational amplifier and said inverting input, and wherein said sweep circuit comprises a Schmitt trigger circuit responsive to the output voltage of said loop filter to provide alternatively a first fixed voltage level and a second fixed voltage level.

10. A phase locked loop comprising:
    a. a phase detector having a temperature dependent output, said phase detector having a first input for receiving an input reference signal, b. a voltage controlled oscillator having an input operatively coupled to the output of said phase detector, c. a feed back circuit operatively coupling the output of said voltage controlled oscillator to a second input of said phase detector, d. a sweep circuit for applying a first constant level current to a terminal in said phase locked loop irrespective of whether or not said phase locked loop is in lock, said current, when said phase locked loop is not in lock, causing an input voltage of said voltage controlled oscillator to be swept to drive its output frequency to a frequency corresponding to the frequency of said input reference signal, and e. said sweep circuit including a resistor network comprising at least a resistor and a thermistor, the thermistor having a temperature dependence which compensates for a temperature dependence within said phase detector.

11. The phase locked loop of claim 10 wherein, in the event the input voltage to said voltage controlled oscillator reaches a predetermined voltage prior to the achievement of lock by said phase locked loop, said sweep circuit applies a second constant level current to said terminal.

12. A method for automatically driving a phase locked loop into the locked condition wherein said phase locked loop comprises a phase detector, said phase detector having a first input for receiving an input signal, a voltage controlled oscillator having an input operatively coupled to the output of said phase detector, and a feedback circuit operatively coupling the output of said voltage controlled oscillator to a second input of said phase detector, said method comprising the steps of:

a. monitoring the signal level at the input of said voltage controlled oscillator to detect the absence of lock in said phase locked loop, b. in the absence of lock, automatically applying a sweep voltage to the input of said voltage controlled oscillator, c. automatically terminating said sweep voltage when lock is acquired and d. generating a temperature dependent signal level to compensate for temperature dependent variations in the transfer function of said phase detector.

13. A method for automatically driving a phase locked loop into the locked condition wherein said phase locked loop includes a phase detector having a first input terminal for receiving an input reference signal, a loop filter having a first input terminal for receiving an output signal from said phase detector and a second input terminal, a voltage controlled oscillator having an input for receiving the output of said loop filter, a feedback circuit operatively coupling the output of said voltage controlled oscillator to a second input terminal of said phase detector, and a sweep circuit cooperating with said loop filter to provide a varying sweep voltage to said voltage controlled oscillator when said phase locked loop is not in a locked condition, said method comprising the steps of:

a. providing a first constant level voltage from said sweep circuit to one terminal of a resistor network including a current limiting resistor and a thermistor having a temperature dependence which compensates for the temperature dependence of said phase detector, the other terminal of said resistor network being coupled to said second input terminal of said loop filter, b. monitoring the output voltage of said loop filter, and, c. in the event that said output voltage reaches a first predetermined level, changing said first constant level voltage to a second constant level voltage.

14. The method of claim 13 including the further step of, in the event that the phase locked loop does not acquire lock during the time when said second constant level voltage is applied to said one terminal of said resistor network, changing said second constant level voltage to said first constant level voltage.

15. The method of claim 12 including the further step of providing a second current path coupling said first and second constant level voltages to said second input terminal of said loop filter, said second path comprising the series combination of a diode and a second resistor, said series combination being placed in parallel with said resistor network.

* * * * *